(12) United States Patent
Nakafuji et al.

(10) Patent No.: US 9,182,671 B2
(45) Date of Patent: Nov. 10, 2015

(54) METHOD FOR FORMING PATTERN, AND COMPOSITION FOR FORMING RESIST UNDERLAYER FILM

(71) Applicant: JSR CORPORATION, Tokyo (JP)

(72) Inventors: Shinya Nakafuji, Tokyo (JP); Satoru Murakami, Tokyo (JP); Yoshio Takimoto, Tokyo (JP); Masayuki Motonari, Tokyo (JP)

(73) Assignee: JSR Corporation, Tokyo (JP)

( * ) Notice: Subject to any disclaimer, the term of this patent is extended or adjusted under 35 U.S.C. 154(b) by 120 days.

(21) Appl. No.: 13/630,340

(22) Filed: Sep. 28, 2012

(65) Prior Publication Data

US 2013/0084705 A1 Apr. 4, 2013

(30) Foreign Application Priority Data

Sep. 30, 2011 (JP) ................................ 2011-218772
Aug. 21, 2012 (JP) ................................ 2012-182784

(51) Int. Cl.
| | |
|---|---|
| *H01L 21/302* | (2006.01) |
| *C08F 10/00* | (2006.01) |
| *G03F 7/095* | (2006.01) |
| *G03F 7/038* | (2006.01) |
| *C08G 61/02* | (2006.01) |
| *H01L 21/027* | (2006.01) |

(52) U.S. Cl.
CPC .............. *G03F 7/095* (2013.01); *G03F 7/0384* (2013.01); *C08G 61/02* (2013.01); *C08G 2261/3422* (2013.01); *H01L 21/0271* (2013.01)

(58) Field of Classification Search
USPC .......... 216/47, 41, 49, 17; 438/703, 781, 694, 438/706; 526/280, 346; 430/270.1, 271.1, 430/280.1, 286.1, 313, 325, 5, 913, 919; 257/E21.219, E21.254, E21.259
See application file for complete search history.

(56) References Cited

U.S. PATENT DOCUMENTS

| | | | |
|---|---|---|---|
| 8,524,847 B2 * | 9/2013 | Sano et al. ..................... 526/282 |
| 2004/0127715 A1 * | 7/2004 | Kunimi et al. ................. 546/285 |
| 2005/0276964 A1 * | 12/2005 | Watanabe et al. ........... 428/304.4 |
| 2013/0189533 A1 * | 7/2013 | Okuyama et al. ............. 428/524 |

FOREIGN PATENT DOCUMENTS

| | | | |
|---|---|---|---|
| JP | 2004-177668 | | 6/2004 |
| JP | 2006285046 A | * | 10/2006 |
| JP | 2008-149447 | | 7/2008 |
| JP | 2009014816 A | * | 1/2009 |
| JP | 2012-079865 | | 4/2012 |

OTHER PUBLICATIONS

JP 2006285046A English Translation, translated on Mar. 13, 2013.*
JP2009014816A English Translation, translated on May 19, 2014.*
Van Dort et al. ("Amelioration of the Leaving Group Ability of the Aryl Sulfone Moiety via Intramolecular Oxygen Silylation", American Chemical Society, 1994, 116, p. 5657-5661).*

* cited by examiner

*Primary Examiner* — Nadine Norton
*Assistant Examiner* — Christopher Remavege
(74) *Attorney, Agent, or Firm* — Oblon, McClelland, Maier & Neustadt, L.L.P.

(57) ABSTRACT

A method for forming a pattern includes providing a resist underlayer film on a substrate using a first composition for forming a resist underlayer film. The first composition includes a polymer having a structural unit represented by a following formula (1). In the formula (1), $Ar^1$ and $Ar^2$ each independently represent a bivalent group represented by a following formula (2). A resist coating film is provided on the resist underlayer film using a resist composition. A resist pattern is formed using the resist coating film. A predetermined pattern is formed on the substrate by sequentially dry-etching the resist underlayer film and the substrate using the resist pattern as a mask.

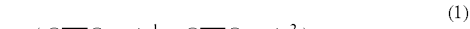

(1)

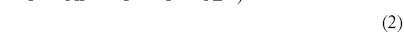

(2)

14 Claims, No Drawings

METHOD FOR FORMING PATTERN, AND COMPOSITION FOR FORMING RESIST UNDERLAYER FILM

CROSS-REFERENCE TO RELATED APPLICATIONS

The present application claims priority under 35 U.S.C. §119 to Japanese Patent Application No. 2011-218772, filed Sep. 30, 2011 and to Japanese Patent Application No. 2012-182784, filed Aug. 21, 2012. The contents of these applications are incorporated herein by reference in their entirety.

BACKGROUND OF THE INVENTION

1. Field of the Invention

The present invention relates to a method for forming a pattern, and a composition for forming a resist underlayer film.

2. Discussion of the Background

In producing elements of integrated circuits, a multilayer resist process has been employed nowadays in order to achieve a higher degree of integration. In brief, according to this process, a composition for forming a resist underlayer film is first coated on a substrate, thereby forming a resist underlayer film, on which a photoresist composition is coated to form a resist coating film, followed by transferring a mask pattern to the resist coating film using a reduced projection exposure system (stepper), etc., and developing with an appropriate developer to obtain a resist pattern. Thereafter, the resist pattern is transferred to the resist underlayer film by dry-etching. Finally, the resist underlayer film pattern is transferred to the substrate by dry-etching to enable a substrate having a desired pattern formed to be obtained.

In the aforementioned multilayer resist process, miniaturization of formed patterns has advanced, and thus further improvement of pattern transfer performances and etching resistance has been demanded for the resist underlayer film. To meet such demands, structures of polymers and functional groups included in polymers and the like contained in compositions for forming a resist underlayer film have been variously investigated (see Japanese Unexamined Patent Application, Publication No. 2004-177668).

SUMMARY OF THE INVENTION

According to one aspect of the present invention, a method for forming a pattern includes providing a resist underlayer film on a substrate using a first composition for forming a resist underlayer film. The first composition includes a polymer having a structural unit represented by a following formula (1).

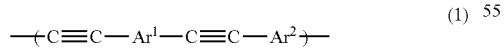

In the formula (1), $Ar^1$ and $Ar^2$ each independently represent a bivalent group represented by a following formula (2).

In the formula (2), $R^1$ and $R^2$ each independently represent a bivalent aromatic group. $R^3$ represents a single bond, —O—, —CO—, —SO— or —SO$_2$—. a is an integer of 0 to 3, wherein in a case where "a" is 2 or more, each of a plurality of $R^2$s and a plurality of $R^3$s are a same or different. A resist coating film is provided on the resist underlayer film using a resist composition. A resist pattern is formed using the resist coating film. A predetermined pattern is formed on the substrate by sequentially dry-etching the resist underlayer film and the substrate using the resist pattern as a mask.

According to another aspect of the present invention, a composition for forming a resist underlayer film includes a polymer having a structural unit represented by a following formula (1).

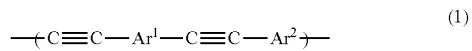

In the formula (1), $Ar^1$ and $Ar^2$ each independently represent a bivalent group represented by the following formula (2).

In the formula (2), $R^1$ and $R^2$ each independently represent a bivalent aromatic group. $R^3$ represents a single bond, —O—, —CO—, —SO— or —SO$_2$—. a is an integer of 0 to 3, wherein in a case where "a" is 2 or more, each of a plurality of $R^2$s and a plurality of $R^3$s are a same or different.

DESCRIPTION OF THE EMBODIMENTS

One aspect of the embodiments of the present invention provides a method for forming a pattern, the method including the steps of:
(1) forming a resist underlayer film on a substrate using a composition for forming a resist underlayer film;
(2) forming a resist coating film on the resist underlayer film using a resist composition;
(3) forming a resist pattern from the resist coating film; and
(4) forming a predetermined pattern on the substrate by sequentially dry-etching the resist underlayer film and the substrate using the resist pattern as a mask,
the composition for forming a resist underlayer film containing
(A) a polymer having a structural unit (I) represented by the following formula (1) (hereinafter, may be also referred to as "polymer (A)"):

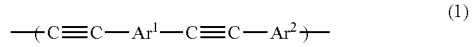

wherein, in the formula (1), $Ar^1$ and $Ar^2$ each independently represent a bivalent group represented by the following formula (2):

wherein, in the formula (2), $R^1$ and $R^2$ each independently represent a bivalent aromatic group; $R^3$ represents a single bond, —O—, —CO—, —SO— or —SO$_2$—; and a is an integer of 0 to 3, wherein provided that "a" is 2 or more, a plurality of $R^2$s and $R^3$s may be each the same or different.

By using the composition for forming a resist underlayer film containing the polymer (A) in the method for forming a pattern, the present method for forming a pattern enables a resist underlayer film having high heat resistance to be formed while maintaining high flexural resistance of the resist underlayer film pattern formed. Therefore, if RIE (Reactive Ion Etching) is used as a method of the dry-etching, disadvantages in etching a substrate using a resist underlayer film as a mask, such as occurrence of deformation of the resist underlayer film pattern such as turning or having a wavy shape are decreased. In addition, sublimation of components of the resist underlayer film by heat in formation of the resist underlayer film, etc., due to low heat resistance, is decreased, whereby readhesion of the sublimated component to the substrate, leading to exacerbation of process yield of manufacture of semiconductor devices is decreased.

It is preferred that $R^1$ and $R^2$ in the above formula (2) are each independently represented by the following formula (3):

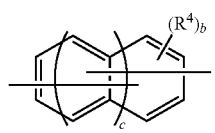

wherein, in the formula (3), $R^4$ represents a halogen atom, a hydroxy group, a cyano group, a nitro group, a monovalent hydrocarbon group having 1 to 20 carbon atoms, an alkoxy group having 1 to 20 carbon atoms or a hydroxyalkyl group having 1 to 20 carbon atoms; b is an integer of 0 to 6, wherein provided that b is 2 or greater, a plurality of $R^4$s may be the same or different; and c is 0 or 1.

When the $R^1$ and $R^2$ represent the specified group, the method for forming a pattern enables a resist underlayer film having even higher heat resistance to be formed.

The weight average molecular weight in terms of the polystyrene equivalent of the polymer (A) is preferably no less than 500 and no greater than 10,000. When the weight average molecular weight in terms of the polystyrene equivalent of the polymer (A) falls within the specified range, coating properties of the composition for forming a resist underlayer film can be improved according to the method for forming a pattern.

It is preferred that the composition for forming a resist underlayer film further contains the solvent (B). When the composition for forming a resist underlayer film further contains the solvent (B), the method for forming a pattern enables coating properties of the composition for forming a resist underlayer film to be further improved.

It is preferred that the composition for forming a resist underlayer film further contains (C) an acid generating agent. When the composition for forming a resist underlayer film further contains the acid generating agent (C), the method for forming a pattern allows the resist underlayer film to be efficiently cured, whereby intermixing of the resist underlayer film and the resist coating film can be inhibited.

It is preferred that the composition for forming a resist underlayer film further contains (D) a crosslinking agent. When the composition for forming a resist underlayer film further contains the crosslinking agent (D), the method for forming a pattern enables the formed resist underlayer film to be further cured by allowing crosslinking agent (D) to be coupled with crosslinkable groups that the polymer (A) and/or other crosslinking agent molecules have.

It is preferred that the resist composition is a photoresist composition, and that the step (3) includes:
(3-1) exposing the resist coating film by selective irradiation with a radioactive ray; and
(3-2) developing the exposed resist coating film.

When the resist composition is a photoresist composition, and the step (3) includes the steps described above, the method for forming a pattern enables a finer pattern to be conveniently and certainly formed.

Another aspect of the embodiments of the present invention provides a composition for forming a resist underlayer which contains the polymer (A) having a structural unit (I) represented by the following formula (1):

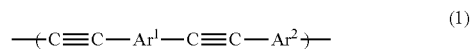

wherein, in the formula (1), $Ar^1$ and $Ar^2$ each independently represent a bivalent group represented by the following formula (2):

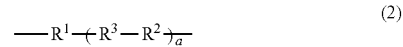

in the formula (2), $R^1$ and $R^2$ each independently represent a bivalent aromatic group; $R^3$ represents a single bond, —O—, —CO—, —SO— or —SO$_2$—; and a is an integer of 0 to 3, wherein provided that "a" is 2 or more, a plurality of $R^2$s and $R^3$s may be each the same or different.

When the composition for forming a resist underlayer film contains the polymer (A) having the specified structural unit, the composition for forming a resist underlayer film can form a resist underlayer film having high heat resistance while maintaining high flexural resistance of the resist underlayer film pattern formed.

It is preferred that $R^1$ and $R^2$ in the above formula (2) are each independently represented by the following formula (3):

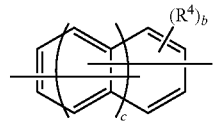

wherein, in the formula (3), $R^4$ represents a halogen atom, a hydroxy group, a cyano group, a nitro group, a monovalent hydrocarbon group having 1 to 20 carbon atoms, an alkoxy group having 1 to 20 carbon atoms or a hydroxyalkyl group having 1 to 20 carbon atoms; b is an integer of 0 to 6, wherein provided that b is 2 or greater, a plurality of $R^4$s may be the same or different; and c is 0 or 1.

When the $R^1$ and $R^2$ in the above formula (2) is the specified group, the composition for forming a resist underlayer film can form a resist underlayer film having even higher heat resistance.

The polymer (A) preferably has a weight average molecular weight in terms of the polystyrene equivalent of no less than 500 and no greater than 10,000. When the weight average molecular weight in terms of the polystyrene equivalent of the polymer (A) falls within the specified range, the composition for forming a resist underlayer film can have improved coating properties.

It is to be noted that the weight average molecular weight (Mw) in terms of the polystyrene equivalent of the polymer (A) means a measurement determined by gel permeation chromatography (detector: differential refractometer) using monodisperse polystyrene as a standard.

Since the composition for forming a resist underlayer film containing the polymer (A) is used in the method for forming a pattern of the embodiment of the present invention, heat resistance of the resist underlayer film can be enhanced while maintaining high flexural resistance of the resist underlayer film pattern formed along with achieving satisfactory characteristics in connection with a refractive index and an attenuation coefficient desired for an resist underlayer film. Therefore, the method for forming a pattern, and the composition for forming a resist underlayer film used in the method can improve a process yield of manufacture of semiconductor devices in manufacturing processes of semiconductors, and thus can be suitably used in manufacturing processes of semiconductor devices for which further miniaturization of the pattern advances. The embodiments will now be described in detail.

<Method for Forming a Pattern>

The method for forming a pattern of the embodiment of the present invention includes the steps of:

(1) forming a resist underlayer film on a substrate using a composition for forming a resist underlayer film (hereinafter, may be also referred to as "step (1)");

(2) forming a resist coating film on the resist underlayer film using a resist composition (hereinafter, may be also referred to as "step (2)");

(3) forming a resist pattern from the resist coating film (hereinafter, may be also referred to as "step (3)"); and (4) forming a predetermined pattern on the substrate by sequentially dry-etching the resist underlayer film and the substrate using the resist pattern as a mask (hereinafter, may be also referred to as "step (4)"), the composition for forming a resist underlayer film containing (A) a polymer having a structural unit (I) represented by above formula (1).

Since a resist underlayer film is formed using the composition for forming a resist underlayer film according to the method for forming a pattern, the method enables heat resistance of the resist underlayer film to be enhanced while maintaining high flexural resistance of the resist underlayer film pattern formed.

It is preferred that the resist composition be a photoresist composition, and that the step (3) includes:

(3-1) exposing the resist coating film by selective irradiation with a radioactive ray (hereinafter, may be also referred to as "(3-1) step"); and (3-2) developing the exposed resist coating film (hereinafter, may be also referred to as "(3-2) step").

When the resist composition is a photoresist composition, and the step (3) includes the steps described above, the method for forming a pattern enables a finer pattern to be conveniently and certainly formed.

[Step (1)]

In this step, a composition for forming a resist underlayer film is used to form a resist underlayer film on a substrate. The composition for forming a resist underlayer film is preferably a composition for forming a resist underlayer film used in a method for forming a pattern in which a photolithography method is used.

The resist underlayer film is formed with a formation method typically including the steps of: forming a coated film on a substrate using the composition for forming a resist underlayer film (1-1) (hereinafter, may be also referred to as "step (1-1)"); and (1-2) forming a resist underlayer film by heating the coated film (hereinafter, may be also referred to as "step (1-2)").

(Step (1-1))

In this step, a coated film is formed on a substrate using the composition for forming a resist underlayer film. As the substrate, for example, a silicon wafer, a wafer covered with aluminum, or the like may be used. Also, the formation method of the composition for forming a resist underlayer film onto the substrate is not particularly limited, and an appropriate method such as a spin coating method, a cast coating method or a roll coating method may be employed.

(Step (1-2))

In this step, a resist underlayer film is formed by heating the coated film. Heating of the coated film is generally carried out in ambient air. The heating temperature is typically 300° C. to 500° C., and preferably about 350° C. to 450° C. When the heating temperature is less than 300° C., the oxidative crosslinking of the underlayer film does not sufficiently proceed, whereby characteristics required as a resist underlayer film may not be exhibited. The heating time is typically 30 sec to 1200 sec, and preferably 60 sec to 600 sec.

The oxygen concentration during forming the coated film (curing) is preferably no less than 5% by volume. When the oxygen concentration during forming the coated film is low, oxidative crosslinking of the resist underlayer film does not sufficiently proceed, whereby characteristics required as a resist underlayer film may not be exhibited.

Prior to heating the coated film at a temperature of 300° C. to 500° C., it may be preheated at a temperature of 60° C. to 250° C. The heating time in the preheating is not particularly limited, and is preferably 10 sec to 300 sec, and more preferably 30 sec to 180 sec. The preheating causes the solvent to vaporize beforehand and makes the film become compact, whereby the dehydrogenation reaction can efficiently proceed.

It is to be noted that the resist underlayer film is usually formed by curing the coated film by heating. However, it is also possible to form the resist underlayer film by adding a certain photocuring agent (crosslinking agent) to the composition for forming a resist underlayer film, and permitting photocuring by subjecting the heated coating film to a step of irradiating with light. The type of radioactive ray used for the exposure is appropriately selected according to the type of (C) an acid generating agent described later added to the composition for forming a resist underlayer film from among visible rays, ultraviolet rays, far ultraviolet rays, X-rays, electron beams, γ-rays, molecular beams, ion beams, and the like. The film thickness of the resist underlayer film formed in the step (1) is typically 0.05 μm to 5 μm.

Also, the method for forming a pattern may further include (1') a step of forming an intermediate layer (intermediate coating film) on the resist underlayer film after the step (1) as needed. The intermediate layer is a layer for reinforcing the functions possessed by the resist underlayer film and/or the resist coating film or for providing functions with the resist underlayer film and/or the resist film which are not possessed by these films, in forming a resist pattern. In the case in which an antireflective film is, for instance, formed as the intermediate layer in a method for forming a pattern using a photolithography process, the intermediate film can reinforce the antireflecting function of the resist underlayer film.

The intermediate layer may be formed from an organic compound or an inorganic oxide. Examples of commercially available products of the organic compound include "DUV-42", "DUV-44", "ARC-28" and "ARC-29" (manufactured by Brewer Science, Inc.), "AR-3" and "AR-19" (manufactured by Lohm and Haas Company), and the like. Examples of commercially available products of the inorganic oxide include "NFC SOG01", "NFC SOG04", "NFC SOG080" (manufactured by JSR Corporation), and the like. Also, polysiloxanes, titanium oxide, oxidized alumina, and tungsten oxide which are formed by a CVD process can be used.

The method of forming the intermediate layer is not particularly limited, and for example, a coating method, a CVD method or the like can be employed. Of these, the coating method is preferred. When the coating method is employed, the intermediate layer may be consecutively formed after forming the resist underlayer film. Also, the film thickness of the intermediate layer is not particularly limited, and appropriately selected in accordance with the function required for the intermediate layer, but is preferably 10 nm to 3,000 nm, and more preferably 20 nm to 300 nm.

[Step (2)]

In this step, a resist coating film is formed on the resist underlayer film using a resist composition. Specifically, after coating the resist composition such that the resultant resist coating film has a predetermined film thickness, the solvent in the coating film is volatilized by prebaking to form the resist coating film.

The resist composition is exemplified by a positive type or negative chemically amplified type resist composition containing a photo acid generating agent, a photoresist composition such as a positive type resist composition constituted with an alkali-soluble resin and a quinonediazide based photosensitizing agent and a negative type resist constituted with an alkali-soluble resin and a crosslinking agent, as well as a composition for use in a nanoimprinting method described in Japanese Unexamined Patent Application, Publication No. 2012-079865, a composition containing a block copolymer for use in a production method of a nanostructured pattern described in Japanese Unexamined Patent Application, Publication No. 2008-149447 (hereinafter, may be also referred to as "directed self-assembled composition"), and the like.

The total solid content of the resist composition is typically about 1% by mass to 50% by mass. In addition, the resist composition is generally subjected to formation of the resist coating film after filtering through a filter with a pore size of about 0.2 μm, for example. It is to be noted that a commercially available resist composition may be used as is in this step.

The coating method of the resist composition is not particularly limited, and for example, a spin coating method or the like may be included. In addition, the temperature of the prebaking may be appropriately adjusted according to the type and the like of the resist composition solution used, but is usually about 30° C. to 200° C., and preferably 50° C. to 150° C.

[Step (3)]

In this step, a resist pattern is formed from the resist coating film. The method for forming a resist pattern is not particularly limited, and for example, a method for forming with a nanoimprinting process, a method for forming using a directed self-assembled composition, a method for forming with a photolithography process, and the like. Of these, a method for forming with photolithography is preferred since a finer pattern can be conveniently and certainly formed. In the case in which a photolithography process is employed, the step (3) usually includes the step (3-1) and step (3-2).

(Step (3-1))

In this step, the resist coating film is exposed by selective irradiation with a radioactive ray. The radioactive ray for use in exposure is appropriately selected according to the type of the photoacid generating agent used in the photoresist composition from among visible rays, ultraviolet rays, far ultraviolet rays, X-rays, electron beams, γ-rays, molecular beams, ion beams, and the like. Of these, far ultraviolet rays are preferred, a KrF excimer laser beam (wavelength: 248 nm), an ArF excimer laser beam (wavelength: 193 nm), an $F_2$ excimer laser beam (wavelength: 157 nm), a $Kr_2$ excimer laser beam (wavelength: 147 nm), an ArKr excimer laser beam (wavelength: 134 nm) and extreme ultraviolet rays (wavelength: 13 nm, etc.) are more preferred, and an ArF excimer laser beam is still more preferred.

After the exposure, post-baking may be carried out for improving resolution, pattern profile, developability, and the like. The temperature of the post-baking is appropriately adjusted in accordance with the type of the photoresist composition used, and typically about 50° C. to 200° C., and preferably 70° C. to 150° C.

(Step (3-2))

In this step, the exposed resist coating film is developed to form a resist pattern. The developer for use in this step is appropriately selected in accordance with the type of the photoresist composition used. Specific examples include alkaline aqueous solutions of sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethyl ethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene or the like. An appropriate amount of a water-soluble organic solvent, for example, an alcohol such as methanol or ethanol, and a surfactant may be optionally added to the alkaline aqueous solution.

The resist film after developing with the aforementioned developer is washed and dried to form a predetermined resist pattern.

[Step (4)]

In this step, a predetermined pattern is formed on a substrate by sequentially dry-etching the resist underlayer film and the substrate using the resist pattern as a mask. In the dry-etching, for example, a gas plasma such as an oxygen plasma, or the like may be used. After the dry-etching of the resist underlayer film, the substrate is dry-etched to obtain a substrate having a predetermined pattern.

<Composition for Forming a Resist Underlayer Film>

In the method for forming a pattern, the composition for forming a resist underlayer film of the embodiment present invention can be suitably used. The composition for forming a resist underlayer film contains the polymer (A). Also, the composition for forming a resist underlayer film may further contain the solvent (B), the acid generating agent (C) and the crosslinking agent (D) as favorable components. Furthermore, the composition for forming a resist underlayer film may contain other optional component within the range not to impair the effects of the present invention. Hereinafter, each component will be described in detail.

<(A) Polymer>

The polymer (A) has the structural unit (I) represented by the above formula (1). In addition, the polymer (A) may have other structural unit. It is to be noted that the polymer (A) may include two or more types of each structural unit.

[Structural Unit (I)]

The structural unit (I) is represented by the above formula (1). When the polymer (A) having the structural unit (I) is contained in the composition for forming a resist underlayer film of the embodiment of the present invention, the composition for forming a resist underlayer film can form a resist underlayer film having high heat resistance while maintaining high flexural resistance of the resist underlayer film pattern formed.

In the above formula (1), $Ar^1$ and $Ar^2$ each independently represent a bivalent group represented by the above formula (2).

In the above formula (2), $R^1$ and $R^2$ each independently represent a bivalent aromatic group; $R^3$ represents a single bond, —O—, —CO—, —SO— or —$SO_2$—; and a is an integer of 0 to 3, wherein provided that a is 2 or greater, a plurality of $R^2$s and $R^3$s may be each the same or different.

The bivalent aromatic group represented by the $R^1$ and $R^2$ is exemplified by a bivalent aromatic hydrocarbon group having 6 to 30 carbon atoms and a bivalent heteroaromatic group having 3 to 30 carbon atoms.

Examples of the bivalent aromatic hydrocarbon group having 6 to 30 carbon atoms include a phenylene group, a naphthylene group, an anthranylene group, and the like.

Examples of the bivalent heteroaromatic group having 3 to 30 carbon atoms include bivalent groups including a pyrrole ring, a pyridine ring, indole ring, a quinoline ring, an acridine ring, etc., and the like.

Hydrogen atoms that the bivalent aromatic hydrocarbon group and the bivalent heteroaromatic group have are unsubstituted or optionally substituted by a substituent. As the substituent, for example, a group represented by $R^4$ described layer may be adopted.

The structural unit (I) preferably has a molecular structure in which a polymer main chain is not bound to opposing sites in an aromatic ring of the bivalent aromatic group or in a heteroaromatic ring of the bivalent heteroaromatic hydrocarbon group, such as e.g., 1,4-positions of a benzene ring, 2,6-positions of a naphthalene ring and 2,6-positions of an anthracene ring, and such a molecular structure is particularly preferred when the $R^3$ represents a single bond, since solubility in a solvent can be whereby improved.

It is preferred that $R^1$ and $R^2$ in the above formula (2) are each independently represented by the above formula (3). When the $R^1$ and $R^2$ represent the specified group, the composition for forming a resist underlayer film can form a resist underlayer film having even higher heat resistance.

In the above formula (3), $R^4$ represents a halogen atom, a hydroxy group, a cyano group, a nitro group, a monovalent hydrocarbon group having 1 to 20 carbon atoms, an alkoxy group having 1 to 20 carbon atoms or a hydroxyalkyl group having 1 to 20 carbon atoms; b is an integer of 0 to 6, wherein provided that b is 2 or greater, a plurality of $R^4$s may be the same or different; and c is 0 or 1.

Examples of the halogen atom include a fluorine atom, a chlorine atom, a bromine atom, an iodine atom, and the like.

The monovalent hydrocarbon group having 1 to 20 carbon atoms represented by the $R^4$ is exemplified by an alkyl group having 1 to 20 carbon atoms, a monovalent alicyclic hydrocarbon group having 3 to 20 carbon atoms, or a monovalent group given by combination of two or more types of these groups, and the like.

Examples of the alkyl group having 1 to 20 carbon atoms include: linear alkyl groups such as a methyl group, an ethyl group, a n-propyl group and a n-butyl group; branched alkyl groups such as an i-propyl group, an i-butyl group, a sec-butyl group and a t-butyl group, and the like.

Examples of the monovalent alicyclic hydrocarbon group having 3 to 20 carbon atoms include: monocyclic saturated hydrocarbon groups such as a cyclopropyl group, a cyclobutyl group, a cyclopentyl group, a cyclohexyl group, a cycloheptyl group, a cyclooctyl group, a cyclodecyl group, a methylcyclohexyl group and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group and cyclodecadiene; polycyclic saturated hydrocarbon groups such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$.0$^{2,7}$]dodecyl group, a norbornyl group and an adamantyl group, and the like.

The monovalent group given by combination of two or more types of the alkyl group having 1 to 20 carbon atoms and the monovalent alicyclic hydrocarbon group having 3 to 20 carbon atoms include groups given by combination of two or more types of the alkyl group having 1 to 20 carbon atoms and the monovalent alicyclic hydrocarbon group having 3 to 20 carbon atoms exemplified above, and the like.

Examples of the alkoxy group having 1 to 20 carbon atoms represented by the $R^4$ include a methoxy group, an ethoxy group, a propoxy group, an isopropoxy group, a butoxy group, an isobutoxy group, a t-butoxy group, and the like.

Examples of the hydroxyalkyl group having 1 to 20 carbon atoms represented by the $R^4$ include a hydroxymethyl group, a 1-hydroxyethyl group, a 2-hydroxyethyl group, a 1-hydroxypropyl group, a 2-hydroxypropyl group, a 3-hydroxypropyl group, a 1-hydroxy-1-methylethyl group, a 2-hydroxy-1-methylethyl group, a 1-hydroxybutyl group, a 2-hydroxybutyl group, a 3-hydroxybutyl group, and the like.

In the above formula (3), b is preferably 0, and c is preferably 0.

The structural unit (I) is preferably structural units represented by the following formulae:

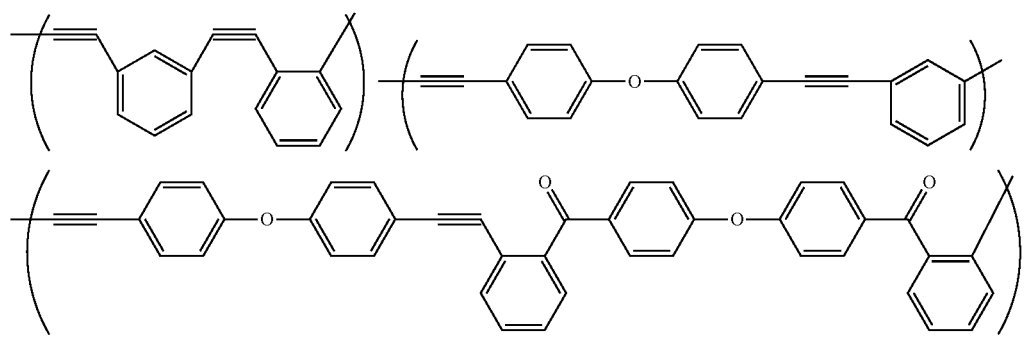

-continued

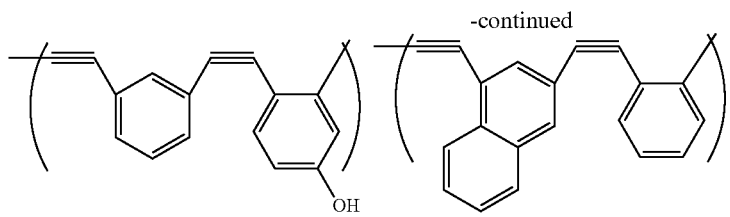

The proportion of the structural unit (I) contained is preferably no less than 50 mol % and no greater than 100 mol %, and more preferably no less than 80 mol % and no greater than 100 mol % with respect to the total of the structural units constituting the polymer (A). When the proportion of the structural unit (I) contained falls within the specified range, the heat resistance can be effectively enhanced, and also flexural resistance can be improved.

[Other Structural Unit]

The polymer (A) may have a structural unit other than the structural unit (I) described above in the range not to impair the effects of the present invention.

<Synthesis Method of Polymer (A)>

In a synthesis method of the polymer (A), for example, a compound (monomer) corresponding to a given structural unit is dissolved in an appropriate reaction solvent and a condensation polymerizing reaction may be allowed in the presence of a catalyst and a basic compound.

Examples of the catalyst include combinations of a palladium compound such as bis(triphenylphosphine)dichloropalladium or bis(triphenylphosphine)dibromopalladium with a monovalent copper compound such as copper(I) chloride, copper(I) bromide or copper(I) iodide, and the like. These catalysts may be used either alone, or in combination of two or more thereof.

Examples of the basic compound include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, and the like. These basic compounds may be used either alone, or in combination of two or more thereof.

The reaction solvent is not particularly limited as long as it is a solvent other than those that inhibit a condensation polymerizing reaction. Examples of the reaction solvent include halogen solvents such as chloroform, dichloromethane, 1,2-dichloroethane, chlorobenzene and dichlorobenzene; aromatic hydrocarbon solvents such as benzene, toluene, xylene, mesitylene and diethyl benzene; ether solvents such as diethyl ether, tetrahydrofuran, dioxane, diglyme and anisole; ketone solvents such as acetone, methylethylketone, 2-heptanone, cyclohexanone and cyclopentanone; ester solvents such as methyl acetate, ethyl acetate, propyl acetate and butyl acetate; amide solvents such as N,N-dimethylformamide, N,N-dimethylacetamide and N-methyl-2-pyrrolidone, and the like.

The polymer (A) obtained by the condensation polymerizing reaction may be recovered preferably by a reprecipitation technique. More specifically, after the condensation polymerizing reaction is completed, the reaction mixture is charged into a solvent for reprecipitation, whereby the target polymer (A) is recovered. As the reprecipitation solvent, an alcohol, an alkane or the like may be used either alone or in combination of two or more thereof. Alternatively to the reprecipitation technique, a liquid separating operation, a column operation, an ultrafiltration operation or the like may be employed to recover the polymer (A) through eliminating low molecular components.

The reaction temperature in these synthesis methods may be appropriately predetermined in accordance with the compound (monomer) that gives the structural unit (I), and the type of the catalyst and/or the basic compound employed.

The polystyrene equivalent weight average molecular weight (Mw) of the polymer (A) as determined by gel permeation chromatography (GPC) is preferably no less than 500 and no greater than 10,000, and more preferably no less than 1,000 and no greater than 5,000. When the Mw of the polymer (A) falls within the specified range, the composition for forming a resist underlayer film enables the intra-plane uniformity of the resist underlayer film to be improved.

<(B) Solvent>

The solvent (B) is a favorable component which may be contained in the composition for forming a resist underlayer film. The solvent (B) is not particularly limited as long as it can dissolve or disperse the polymer (A) and any optional component contained if necessary. When the composition for forming a resist underlayer film further contains the solvent (B), the composition for forming a resist underlayer film enables coating properties to be further improved. The solvent (B) is exemplified by an alcohol solvent, a ketone solvent, an amide solvent, an ether solvent, an ester solvent, and the like. The solvent (B) may be used alone, or in combination of two or more thereof.

Examples of the alcohol solvent include: monoalcohol solvents such as methanol, ethanol, n-propanol, iso-propanol, n-butanol, iso-butanol, sec-butanol, t-butanol, n-pentanol, iso-pentanol, sec-pentanol and t-pentanol; polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, and the like.

Examples of the ketone solvent include aliphatic ketone solvents such as acetone, methylethylketone, methyl-n-propylketone, methyl-n-butylketone, diethyl ketone, methyl-isobutyl ketone, methyl-n-pentyl ketone, ethyl-n-butyl ketone, methyl-n-hexylketone, di-iso-butylketone and trimethyl nonanone; cyclic ketone solvents such as cyclopentanone, cyclohexanone, cycloheptanone, cyclooctanone and methylcyclohexanone; 2,4-pentanedione, acetonyl acetone, diacetone alcohol, acetophenone, and the like.

Examples of the amide solvent include N,N'-dimethyl imidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ether solvent include alkyl ethers of polyhydric alcohols such as ethylene glycol monomethyl ether, ethylene glycol monoethyl ether and ethylene glycol dimethyl ether; alkyl ether acetates of polyhydric alcohols such as ethylene glycol monomethyl ether acetate, ethylene glycol monoethyl ether acetate and propylene glycol methyl ether acetate; aliphatic ethers such as diethyl ether, dipropyl ether, dibutyl ether, butylmethyl ether, butylethyl ether and diisoamyl ether; aliphatic aromatic ethers such as anisole and phenylethyl ether; cyclic ethers such as tetrahydrofuran, tetrahydropyran and dioxane, and the like.

Examples of the ester solvent include diethyl carbonate, propylene carbonate, methyl acetate, ethyl acetate, γ-valerolactone, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, and the like.

Of these solvents, the ether solvent and the ketone solvent are preferred, a polyhydric alcohol such as alkyl ether acetates and cyclic ketone solvent are more preferred, and propylene glycol methyl ether acetate and cyclohexanone are particularly preferred.

<[C] Acid Generating Agent>

The acid generating agent (C) is a favorable component which may be contained in the composition for forming a resist underlayer film. When the composition for forming a resist underlayer film contains the acid generating agent (C), the composition for forming a resist underlayer film enables the resist underlayer film to be efficiently cured, end intermixing of the resist underlayer film with the resist coating film to be suppressed. The acid generating agent (C) may be used alone, or in combination of two or more thereof.

The acid generating agent (C) is exemplified by an onium salt compound, a sulfonimide compound, and the like. Of these, an onium salt compound is preferred.

Examples of the onium salt compound include sulfonium salts, tetrahydrothiophenium salts, iodonium salts, and the like.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, triphenylphosphonium 1,1,2,2-tetrafluoro-6-(1-adamantanecarbonyloxy)-hexane-1-sulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, and the like. Of these, triphenylsulfonium trifluoromethanesulfonate, triphenylsulfonium nonafluoro-n-butanesulfonate, triphenylphosphonium 1,1,2,2-tetrafluoro-6-(1-adamantanecarbonyloxy)-hexane-1-sulfonate, and 4-cyclohexylphenyldiphenylsulfonium nonafluoro-n-butanesulfonate are preferred.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, and the like. Among these tetrahydrothiophenium salts, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, and 1-(3,5-dimethyl-4-hydroxyphenyl)tetrahydrothiophenium nonafluoro-n-butanesulfonate are preferred.

Examples of the iodonium salt include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like. Of these iodonium salts, bis(4-t-butylphenyl)iodonium nonafluoro-n-butanesulfonate is preferred.

Examples of the sulfonimide compound include N-(trifluoromethanesulfonyloxy)bicyclo[2.2.1]hept-5-ene-2,3-dicarboxylmide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy)bicyclo[2.2.1]hept-5-ene-2,3-dicarboxylmide, and the like.

The content of the acid generating agent (C) is preferably no less than 1 part by mass and no greater than 50 parts by mass, and more preferably no less than 3 parts by mass and no greater than 20 parts by mass with respect to 100 parts by mass of the polymer (A). When the content of the acid generating agent (C) is less than 1 part by mass, curability may be lowered, whereas when the content exceeds 50 parts by mass, coating properties may be deteriorated.

<(D) Crosslinking Agent>

The crosslinking agent (D) is a favorable component which may be contained in the composition for forming a resist underlayer film. When the composition for forming a resist underlayer film contains the crosslinking agent (D), the composition for forming a resist underlayer film allows the crosslinking agent (D) to be bound to a crosslinkable group that the polymer (A) has, and enables the formed resist underlayer film to be further cured. The crosslinking agent (D) is exemplified by polyfunctional (meth)acrylate compounds, epoxy compounds, hydroxymethyl group-substituted phenol compounds, compounds having an alkoxyalkylated amino group, and the like. It is to be noted that the crosslinking agent (D) may be used either alone, or in combination of two or more thereof.

Examples of the polyfunctional (meth)acrylate compound include trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl)isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentylglycol di(meth)acrylate, diethylene glycol di(meth)acrylate, triethylene glycol di(meth)acrylate, dipropylene glycol di(meth)acrylate, bis(2-hydroxyethyl)isocyanurate di(meth)acrylate, and the like.

The epoxy compound is exemplified by novolak epoxy resins, bisphenol epoxy resins, alicyclic epoxy resins, aliphatic epoxy resins, and the like.

Examples of the hydroxymethyl group-substituted phenol compound include 2-hydroxymethyl-4,6-dimethylphenol, 1,3,5-trihydroxymethylbenzene, 3,5-dihydroxymethyl-4-methoxytoluene[2,6-bis(hydroxymethyl)-p-cresol], and the like.

The compound having an alkoxyalkylated amino group is exemplified by nitrogen-containing compounds that include a plurality of active methylol groups in a molecule, with at least one hydrogen atom of the hydroxyl groups of the methylol groups being substituted by an alkyl group such as a methyl group or a butyl group, such as (poly)methylolated melamine, (poly)methylolated glycoluril, (poly) methylolated benzoguanamine and (poly)methylolated urea, and the like. It is to be noted that the compound having an alkoxyalkylated amino group may be a mixture of a plurality of substituted compounds, and may contain a partially self-condensed oligomer component.

Of these crosslinking agents, compounds having an alkoxyalkylated amino group are preferred, and 1,3,4,6-tetrakis(methoxymethyl)glycoluril is more preferred.

The content of the crosslinking agent (D) is preferably no less than 3 parts by mass and no greater than 100 parts by mass, and more preferably no less than 5 parts by mass and no greater than 50 parts by mass with respect to 100 parts by mass of the polymer (A). When amount of the crosslinking agent (D) blended is less than 3 parts by mass, the resist underlayer film formed may have insufficient hardness. On the other hand, when the amount of the crosslinking agent (D) blended exceeds 100 parts by mass, the coating properties may be deteriorated.

<Other Optional Components>

The composition for forming a resist underlayer film may contain optional component(s) other than the polymer (A) as an essential component, and the solvent (B), the acid generating agent (C) and the crosslinking agent (D) as favorable components, without impairing the effects of the present invention. In addition, the content of the other optional component may be predetermined in accordance with the intended purpose of the addition.

<Preparation Method of Composition for Forming a Resist Underlayer Film>

The composition for forming a resist underlayer film may be prepared by mixing the polymer (A) as an essential component, the solvent (B), the acid generating agent (C) and the crosslinking agent (D) as favorable components, and if necessary the other optional component(s), etc., at a certain ratio.

EXAMPLES

Hereinafter, the present invention will be more specifically explained by way of Examples, but the present invention is not limited to these Examples.

It is to be noted that the weight average molecular weight in terms of the polystyrene equivalent (Mw) of the polymer (A) was determined by gel permeation chromatography (detector: "differential refractometer") using "GPC column" (G2000HXL: two columns; and G3000HXL: one column) manufactured by Tosoh Corporation under an analytical condition including a flow rate of 1.0 mL/min and a column temperature of 40° C. with tetrahydrofuran as an elution solvent, using mono-dispersed polystyrene as a standard.

<Synthesis of Polymer (A)>

Synthesis Example 1

Synthesis of Polymer (A-1)

In a separable flask equipped with a thermometer, 100 part by mass of 1,2-diiodobenzene and 100 parts by mass of 1,3-diethynylbenzene as monomers, 3 parts by mass of bis (triphenylphosphine)dichloropalladium and 2 parts by mass of copper(I) iodide as catalysts, 200 parts by mass of piperidine as a basic compound and 500 parts by mass of tetrahydrofuran as a solvent were blended in a nitrogen atmosphere, and a condensation polymerizing reaction was allowed while stirring at 30° C. for 4 hrs to obtain a reaction liquid. Methanol was added to the reaction liquid to permit reprecipitation, and the resulting precipitate was dried to give a polymer (A-1) having a structural unit represented by the following formula. The Mw of the polymer (A-1) was 2,000.

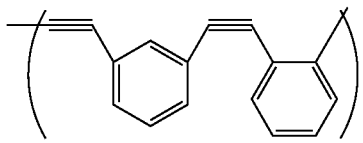

Synthesis Example 2

Synthesis of Polymer (A-2)

In a separable flask equipped with a thermometer, 100 parts by mass of 1,3-diiodobenzene and 100 parts by mass of 4,4'-diethynyldiphenyl ether as monomers, 3 parts by mass of bis(triphenylphosphine)dichloropalladium and 2 parts by mass of copper(I) iodide as catalysts, 200 parts by mass of piperidine as a basic compound and 500 parts by mass of tetrahydrofuran as a solvent were blended in a nitrogen atmosphere, and a condensation polymerizing reaction was allowed while stirring at 30° C. for 4 hrs to obtain a reaction liquid. Methanol was added to the reaction liquid to permit reprecipitation, and the resulting precipitate was dried to give a polymer (A-2) having a structural unit represented by the following formula. The Mw of the polymer (A-2) was 3,000.

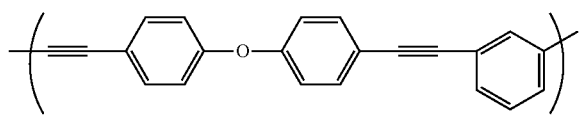

Synthesis Example 3

Synthesis of Polymer (A-3)

In a separable flask equipped with a thermometer, 100 parts by mass of 4,4'-(di-o-iodobenzoyl)diphenyl ether and 100 parts by mass of 4,4'-diethynyldiphenyl ether as monomers, 3 parts by mass of bis(triphenylphosphine)dichloropalladium and 2 parts by mass of copper(I) iodide as catalysts, 200 parts by mass of piperidine as a basic compound and 500 parts by mass of tetrahydrofuran as a solvent were blended in a nitrogen atmosphere, and a condensation polymerizing reaction was allowed while stirring at 30° C. for 4 hrs to obtain a reaction liquid. Methanol was added to the reaction liquid to permit reprecipitation, and the resulting precipitate was dried to give a polymer (A-3) having a structural unit represented by the following formula. The Mw of the polymer (A-3) was 4,000.

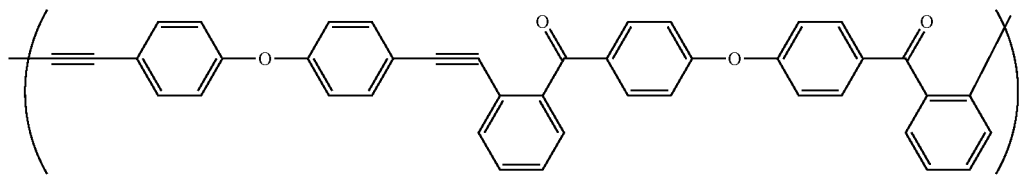

Synthesis Example 4

Synthesis of Polymer (a-1)

In a separable flask equipped with a thermometer, 100 parts by mass of 1,3-diethynylbenzene and 150 parts by mass of phenylacetylene as monomers, 100 parts by mass of copper chloride as a catalyst and 1,000 parts by mass of pyridine as a basic compound were blended in a nitrogen atmosphere, and a condensation polymerizing reaction was allowed while stirring at 30° C. for 1 hour to obtain a reaction liquid. A mixture of isopropyl alcohol/water (mass ratio: 1/1) was added to the reaction liquid to permit reprecipitation, and the resulting precipitate was dried to give a polymer (a-1) having a structural unit represented by the following formula. The Mw of the polymer (a-1) was 1,500.

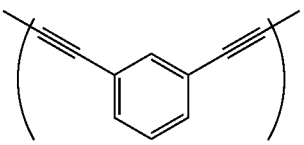

<Preparation of Composition for Forming a Resist Underlayer Film>

Each component other than the polymer (A) is shown below.

(B) Solvent

B-1: cyclohexanone (C) Acid generating agent a compound represented by the following formula (C-1)

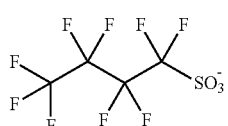

(C-1)

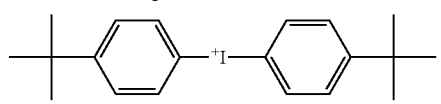

(D) Crosslinking Agent a compound represented by the following formula (D-1) (manufactured by Nikaluck N-2702, SANWA Chemical Co., Ltd)

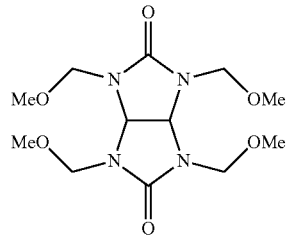

(D-1)

Example 1

A solution was obtained by mixing 10 parts by mass of the polymer (A-1) as the polymer (A) and 100 parts by mass of the solvent (B-1) as the solvent (B). Then, the solution was filtered through a membrane filter having a pore size of 0.1 μm to prepare a composition for forming a resist underlayer film.

Examples 2 to 4 and Comparative Example 1

Each composition for forming a resist underlayer film was prepared by an operation similar to Example 1 except that the type of each mixed component and the amount blended (parts by mass) were as shown in Table 1. It is to be noted that in Table 1, the denotation "-" of indicates that the corresponding component was not blended.

TABLE 1

| | [A] Component | | [B] Solvent | | [C] Acid generating agent | | (D) Crosslinking agent | |
|---|---|---|---|---|---|---|---|---|
| | type | parts by mass | type | parts by mass | type | parts by mass | type | parts by mass |
| Example 1 | A-1 | 10 | B-1 | 100 | — | — | — | — |
| Example 2 | A-2 | 10 | B-1 | 100 | — | — | — | — |
| Example 3 | A-3 | 10 | B-1 | 100 | — | — | — | — |
| Example 4 | A-3 | 10 | B-1 | 100 | C-1 | 0.5 | D-1 | 1 |
| Comparative Example 1 | a-1 | 10 | B-1 | 100 | — | — | — | — |

<Synthesis of Base Polymer used in Photoresist Composition>

Synthesis Example 5

A compound (M-1) represented by the following formula in an amount of 11.92 g, 41.07 g of the compound (M-2), 15.75 g of the compound (M-3), 11.16 of the compound (M-4) and 20.10 g of the compound (M-5) and 3.88 g of dimethyl 2,2'-azobis(2-isobutyronitrile) were dissolved in 200 g of 2-butanone. Into a 1,000 mL three-neck flask was charged 100 g of 2-butanone, and nitrogen was purged for 30 min, followed by heating the reaction vessel at 80° C. while stirring the mixture. Thereto was added the solution dropwise over 4 hrs, and after completing the dropwise addition, the solution was aged at 80° C. for 2 hrs. After completing the polymerization, the polymerization solution was water cooled to lower the temperature to no greater than 30° C. The polymerization solution was vacuum concentrated with an evaporator until the mass of the polymerization solution became 200 g. Thereafter, the polymerization liquid was charged into 1,000 g of methanol to execute a reprecipitation operation. The precipitated slurry was filtered by vacuum filtration, and the solid content was washed with methanol three times. The obtained powder was vacuum dried at 60° C. for 15 hrs to obtain 88.0 g (yield: 88%) of a white powder (base polymer). The base polymer obtained had an Mw of 9,300, and the Mw/Mn of 1.60. As a result of the $^{13}$C-NMR analysis, proportions of structural units derived from the compounds (M-1), (M-2), (M-3), (M-4) and (M-5) were 16 mol %, 26 mol %, 19 mol %, 11 mol % and 28 mol %, respectively. It is to be noted that (JNM-ECP500 manufactured by JEOL, Ltd.) was used for the $^{13}$C-NMR analysis.

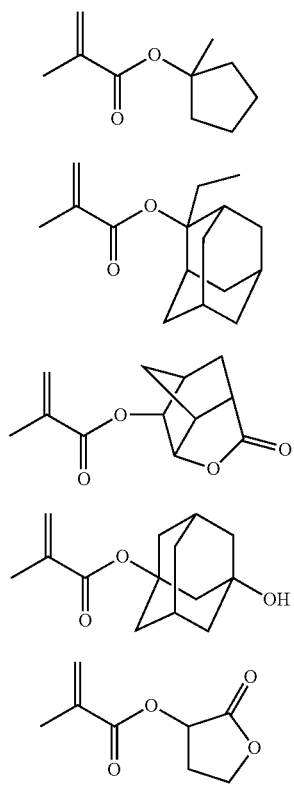

<Synthesis of Fluorine-Containing Polymer Used in the Photoresist Composition>

Synthesis Example 6

A compound (M-6) represented by the following formula in an amount of 3.8 g and 1.2 g of the compound (M-7) were dissolved in 10 g of 2-butanone, and further 0.09 g of 2,2'-azobis(2-isobutyronitrile) was charged in a 100 mL three-neck flask. After nitrogen was purged for 30 min, the reaction vessel was heated to 80° C. while stirring the mixture. The polymerization reaction was carried out for 6 hrs from the time when heating was started which was assumed to be a start time point of polymerization. After completing the polymerization, the polymerization solution was water cooled to lower the temperature to no greater than 30° C. and vacuum concentrated with an evaporator until the mass of the polymerization solution became 12.5 g. The polymerization liquid was slowly charged into 75 g of n-hexane which had been cooled to 0° C. to allow the solid content to be precipitated. The mixed liquid was filtrated, and the solid content was washed with n-hexane. The powder thus obtained was vacuum dried at 40° C. for 15 hrs to obtain 3.75 g of a white powder (fluorine-containing polymer) (yield: 75%). The fluorine-containing polymer had an Mw of 9,400, and the Mw/Mn of 1.50. As a result of the $^{13}$C-NMR analysis, proportions of structural units derived from the compounds (M-6) and (M-7) were 68.5 mol % and 31.5 mol %, respectively. The fluorine atom content was 21.4% by mass.

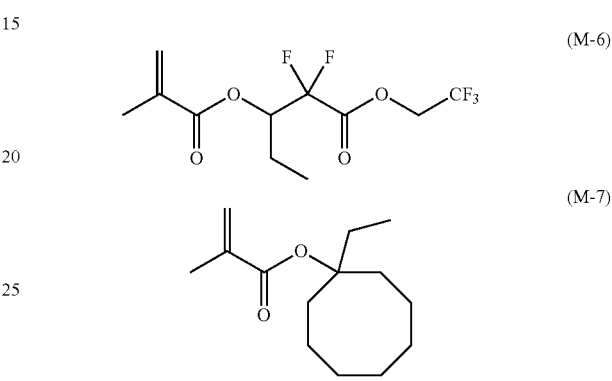

<Preparation of Photoresist Composition>

Preparation Example

Triphenylsulfonium trifluoromethanesulfonate in an amount of 8 parts by mass as an acid generating agent, 100 parts by mass of the base polymer obtained in Synthesis Example 5, 5 parts by mass of the fluorine-containing polymer obtained in Synthesis Example 6, and 0.6 parts by mass of N-t-amyloxycarbonyl-4-hydroxypiperidine as an acid diffusion control agent were added to 1,881 parts by mass of propylene glycol monomethyl ether acetate, 806 parts by mass of cyclohexanone and 200 parts by mass of γ-butyrolactone to give a solution. This solution was filtered through a membrane filter having a pore size of 0.1 μm to prepare a photoresist composition.

<Evaluation>

Refractive index, attenuation coefficient, flexural resistance and heat resistance were determined, and the results are shown in Table 2.

[Refractive Index and Attenuation Coefficient]

After each composition for forming a resist underlayer film prepared as described above was spin coated on the surface of a silicon wafer having a diameter of 8 inch as a substrate, a resist underlayer film having a film thickness of 250 nm was formed by heating at 350° C. for 2 min. Then, using a spectroscopic ellipsometer (M2000D, manufactured by J. A. WOOLLAM), the refractive index and the attenuation coefficient at a wavelength of 193 nm of the formed resist underlayer film were measured. In these respects, the composition was evaluated to be favorable when the refractive index was no less than 1.3 and no greater than 1.6, and the attenuation coefficient was no less than 0.2 and no greater than 0.8.

[Flexural Resistance]

An oxidized silicon film having a thickness of 0.3 μm was deposited on a silicon wafer having a diameter of 12 inch by a CVD method. Next, each composition for forming a resist underlayer film was spin coated, followed by heating at 350° C. for 120 sec to form a resist underlayer film having a film thickness of 0.25 μm. Subsequently, a composition solution of intermediate layer for 3-layer resist process (NFC SOG508, manufactured by JSR Corporation) was spin coated on the resist underlayer film, followed by heating at 200° C. for 60 sec, and subsequent heating at 300° C. for 60 sec to form an intermediate layer coating film having a film thickness of 0.04 μm. Next, the photoresist composition obtained in the aforementioned Preparation Example was spin coated on the intermediate layer coating film, and prebaking carried out at 100° C. for 60 sec formed a resist coating film having a film thickness of 0.1 μm.

Next, the resist coating film was exposed through a mask using ArF Immersion Scanner (numerical aperture of the lens: 1.30; and exposure wavelength: 193 nm, manufactured by NIKON) for an optimum exposure time. Next, after postbaking at 100° C. for 60 sec, the resist coating film was developed with a 2.38% by mass aqueous tetramethylammonium hydroxide solution. Thereafter, washing with water and drying gave a positive type resist pattern. Subsequently, using the resist coating film having thus formed pattern as a mask, the intermediate layer coating film was subjected to a dry-etching treatment by a carbon tetrafluoride gas using a reactive ion-etching apparatus (Telius SCCM, manufactured by Tokyo Electron Limited), and the etching treatment was stopped when the intermediate layer coating film positioned under the opening portion of the resist coating film was removed, whereby resist pattern was transferred to the intermediate layer coating film.

Thereafter, a dry-etching treatment with a mixed gas of oxygen and nitrogen was carried out with the etching apparatus, using as a mask the intermediate layer coating film to which the resist pattern was transferred, and the etching treatment was stopped when the resist underlayer film positioned under the opening portion of the intermediate layer coating film, whereby the pattern of the intermediate layer coating film was transferred to the resist underlayer film. Next, a dry-etching treatment with a mixed gas of carbon tetrafluoride and argon was carried out with the etching apparatus, using as a mask the resist underlayer film to which the pattern of the intermediate layer coating film was transferred, and the etching treatment was stopped when 0.1 μm of the oxidized silicon film positioned under the opening of the resist underlayer film was removed.

Then, the shape of a line-and-space pattern, as generally referred to, in which substantially straight lines among the resist underlayer film pattern left on the substrate were arranged at regular intervals, was observed by an SEM (scanning electron microscope). In this line-and-space pattern, 100 substantially straight lines were arranged at regular intervals, with repeating constant intervals of 84 nm, and this assembly was regarded as one set. On one substrate, sets of the pattern having different line widths were included, with the line widths varying by 1 nm from 50 nm to 30 nm. The line width as referred to herein means the width of one substantially straight line arranged at regular intervals formed with the resist underlayer film. In the pattern of the same configuration on the substrate, the state of the pattern having each line width at arbitrary five points was observed by the SEM. The results of observation were evaluated to decide flexural resistance. In this regard, the flexural resistance was evaluated as: favorable "A" when all the lines of the pattern of the resist underlayer film stood vertically; and unfavorable "B" when at least one curved portion was found.

[Heat Resistance]

Each composition for forming a resist underlayer film was spin coated on a silicon wafer having a diameter of 8 inch to form a coated film (resist underlayer film), and the film thickness of the coated film was measured using the spectroscopic ellipsometer (this measurement being designated by X). Next, this resist underlayer film was heated at 350° C. for 120 sec, and the film thickness of the heated resist underlayer film was measured using the spectroscopic ellipsometer (this measurement being designated as Y). Thereafter, the rate of decrease in the film thickness of the resist underlayer film after heating with respect to that before heating, ΔFT (%) (ΔFT (%)=100×(X−Y)/X) was measured, and the measurement was defined as a heat resistance (%). It is to be noted that the smaller heat resistance (%) value suggests that there are less sublimated matter generated during heating the resist underlayer film and degradation products of the film, indicating that the film is favorable (high heat resistance).

TABLE 2

| | Refractive index | Attenuation coefficient | Flexural resistance | Heat resistance (%) |
|---|---|---|---|---|
| Example 1 | 1.42 | 0.65 | A | 11 |
| Example 2 | 1.41 | 0.63 | A | 11 |
| Example 3 | 1.40 | 0.65 | A | 11 |
| Example 4 | 1.41 | 0.65 | A | 11 |
| Comparative Example 1 | 1.45 | 0.54 | A | 14 |

As is clear from Table 2, the compositions for forming a resist underlayer film of Examples 1 to 4 had higher heat resistance than Comparative Example 1, along with satisfactory characteristics in connection with a refractive index, an attenuation coefficient and flexural resistance.

The embodiment of the present invention provides a method for forming a pattern and a composition for forming a resist underlayer film capable of forming a resist underlayer film having high heat resistance, along with achieving satisfactory characteristics in connection with a refractive index and an attenuation coefficient desired for an resist underlayer film, while maintaining high flexural resistance of the resist underlayer film pattern formed. Therefore, according to the embodiment of the present invention, improvement of a process yield of manufacture of semiconductor devices in manufacturing processes of semiconductors is enabled, and thus the present method for forming a pattern and composition for forming a resist underlayer film can be suitably used in manufacturing processes of semiconductor devices for which further miniaturization of the pattern advances.

Obviously, numerous modifications and variations of the present invention are possible in light of the above teachings. It is therefore to be understood that within the scope of the appended claims, the invention may be practiced otherwise than as specifically described herein.

What is claimed is:

1. A method for forming a pattern, comprising:
providing a resist underlayer film on a substrate using a first composition for forming a resist underlayer film, the first composition comprising:
a polymer comprising a structural unit represented by formula (1):

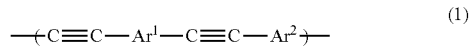

wherein, in the formula (1), $Ar^1$ and $Ar^2$ each independently represent a bivalent group represented by formula (2):

wherein, in the formula (2), $R^1$ and $R^2$ each independently represent a bivalent aromatic group; $R^3$ represents a single bond, —O—, —CO—, —SO— or —SO$_2$—; and a is an integer of 0 to 3, wherein in a case where "a" is 2 or more, each of a plurality of $R^2$s and a plurality of $R^3$ are a same or different;

providing a resist coating film on the resist underlayer film using a resist composition;

forming a resist pattern using the resist coating film; and forming a predetermined pattern on the substrate by sequentially dry-etching the resist underlayer film and the substrate using the resist pattern as a mask.

2. The method according to claim 1, wherein $R^1$ and $R^2$ in the formula (2) are each independently represented by formula (3):

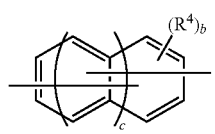

(3)

wherein, in the formula (3),

R$^4$ represents a halogen atom, a hydroxy group, a cyano group, a nitro group, a monovalent hydrocarbon group having 1 to 20 carbon atoms, an alkoxy group having 1 to 20 carbon atoms or a hydroxyalkyl group having 1 to 20 carbon atoms;

b is an integer of 0 to 6, wherein in a case where b is 2 or greater, a plurality of R$^4$s are a same or different; and c is 0 or 1.

3. The method according to claim 1, wherein a weight average molecular weight in terms of a polystyrene equivalent of the polymer is no less than 500 and no greater than 10,000.

4. The method according to claim 1, wherein the first composition further comprises a solvent.

5. The method according to claim 1, wherein the first composition further comprises an acid generating agent.

6. The method according to claim 1, wherein the first composition further comprises a crosslinking agent.

7. The method according to claim 1, wherein the step of forming the resist pattern comprises:

exposing the resist coating film by selective irradiation with the radioactive ray; and developing the exposed resist coating film.

8. A composition for forming a resist underlayer film, comprising:

a polymer comprising a structural unit represented by formula (1):

(1)

wherein, in the formula (1), Ar$^1$ and Ar$^2$ each independently represent a bivalent group represented by the formula (2):

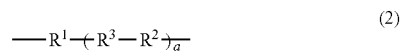

(2)

wherein, in the formula (2), $R^1$ and $R^2$ each independently represent a bivalent aromatic group; $R^3$ represents a single bond, —O—, —CO—, —SO— or —SO$_2$—; and a is an integer of 0 to 3, wherein in a case where "a" is 2 or more, each of a plurality of $R^2$s and a plurality of $R^3$s are a same or different.

9. The composition for forming a resist underlayer film according to claim 8, wherein $R^1$ and $R^2$ in the formula (2) are each independently represented by formula (3):

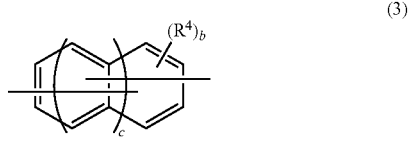

(3)

wherein, in the formula (3),

R$^4$ represents a halogen atom, a hydroxy group, a cyano group, a nitro group, a monovalent hydrocarbon group having 1 to 20 carbon atoms, an alkoxy group having 1 to 20 carbon atoms or a hydroxyalkyl group having 1 to 20 carbon atoms;

b is an integer of 0 to 6, wherein in a case where b is 2 or greater, a plurality of R$^4$s are a same or different; and c is 0 or 1.

10. The composition for forming a resist underlayer film according to claim 8, wherein a weight average molecular weight in terms of a polystyrene equivalent of the polymer is no less than 500 and no greater than 10,000.

11. The method according to claim 1, wherein an amount of the structural unit contained in the polymer is no less than 50 mol % with respect to a total of the structural units constituting the polymer.

12. The method according to claim 1, wherein an amount of the structural unit contained in the polymer is no less than 80 mol % with respect to a total of the structural units constituting the polymer.

13. The composition for forming a resist underlayer film according to claim 8, wherein an amount of the structural unit contained in the polymer is no less than 50 mol % with respect to a total of the structural units constituting the polymer.

14. The composition for forming a resist underlayer film according to claim 8, wherein an amount of the structural unit contained in the polymer is no less than 80 mol % with respect to a total of the structural units constituting the polymer.

\* \* \* \* \*